US006323701B1

(12) United States Patent
Gradinariu et al.

(10) Patent No.: US 6,323,701 B1
(45) Date of Patent: Nov. 27, 2001

(54) SCHEME FOR REDUCING LEAKAGE CURRENT IN AN INPUT BUFFER

(75) Inventors: Iulian C. Gradinariu; Keith A. Ford, both of Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/222,578

(22) Filed: Dec. 28, 1998

(51) Int. Cl.[7] ..................................................... H03B 1/00
(52) U.S. Cl. ......................... 327/109; 327/322; 327/530; 326/27; 326/83; 307/412
(58) Field of Search ........................... 327/108–112, 306, 327/309, 318, 319, 323, 333, 322, 530; 326/62–63, 82–92, 26, 27, 71; 307/412; 361/11

(56) References Cited

U.S. PATENT DOCUMENTS

| 4,672,243 | * 6/1987 | Kirsch | 326/71 |
|---|---|---|---|
| 4,825,106 | 4/1989 | Tipon et al. | 326/121 |
| 4,985,639 | 1/1991 | Renfrow et al. | 327/243 |
| 5,119,334 | 6/1992 | Fujii | 365/189.11 |
| 5,151,620 | 9/1992 | Lin | 326/71 |
| 5,264,745 | 11/1993 | Woo | 326/62 |
| 5,389,828 | 2/1995 | Tago | 327/263 |
| 5,438,550 | 8/1995 | Kim | 365/233.5 |
| 5,600,274 | 2/1997 | Houston | 327/262 |
| 5,696,463 | 12/1997 | Kwon | 327/172 |

OTHER PUBLICATIONS

Memory 1996, Complete Coverage of DRAM, SRAM, EPROM and Flash Memory ICs by J. Griffin and B, Matas, Integrated Circuit Engineering Corporation, pp. 7–1 to 10–10, 1996.

3rd Edition Practical Digital Design Using UCs by J. Greenfield, Regents/Prentice Hall, pp. 416–433, 1994.

* cited by examiner

Primary Examiner—Kenneth B. Wells
Assistant Examiner—Minh Nguyen
(74) Attorney, Agent, or Firm—Wagner Murabito & Hao LLP

(57) ABSTRACT

A circuit for addressing leakage. The circuit may have a variable supply stage having an active load in parallel with a switch transistor where the active load and the switch transistor are coupled to a decoupling capacitor. The circuit may also have a leakage detect stage having a leak device coupled to a critical node. An embodiment of the circuit may have a supply node; an input node; an output node; a buffer stage where the buffer stage supply node is coupled to a variable supply stage output, the buffer stage input is coupled to the input node and the buffer stage output is coupled to the output node; a leakage detect stage where the leakage detect stage supply node is coupled to the supply node and the leakage detect stage input is coupled to the input node; and a variable supply stage where the variable supply stage supply node is coupled to the supply node and the variable supply stage input is coupled to the leakage detect stage output.

36 Claims, 13 Drawing Sheets

SCHEME FOR REDUCING LEAKAGE CURRENT IN AN INPUT BUFFER

FIELD OF INVENTION

The present application relates to the field of electronic circuitry. In particular the present application discloses apparatus and methods for addressing leakage in CMOS environments.

BACKGROUND OF THE INVENTION

A problem associated with leakage is shown in FIG. 1. FIG. 1 shows a typical CMOS inverter circuit 100. CMOS logic circuits are specified to be compatible not only for CMOS level (0 to 3.3 v) input signals but also TTL level (0.4 to 2.4 v) input signals. The TTL requirement typically causes leakage in PFET 101a. Specifically, if input node 103a has a TTL level logic high ($V_{IH}$) input of 2.4 volts, the gate to source voltage of PFET 101a is 0.9 volts for a 3.3 volt supply node 105a. Such a voltage causes PFET 101a to turn "on".

However, since this is an inverting circuit, a logic high input ideally turns PFET 101a "off" and NFET 102a "on" resulting in ground voltage at output node 104a and no current flow from supply node 105a through PFET 101a.

If the TTL high input turns PFET 101a "on", leakage current flows from supply node 105a through PFET 101a (and most likely through NFET 102a to round). Obviously, an integrated circuit having potentially tens or hundreds of inverting or similar circuits will dramatically increase its power consumption if the leakage just described occurs. Thus, some form of addressing the leakage is necessary.

Some solutions for addressing this leakage problem boost the input voltage after its supplied at input node 103a such that the voltage at the gate of PFET 101a is high enough to cut off PFET 101a. However, this solution is not permissible with specifications requiring high input resistance. Thus the solution is not practicable in relation to most all industry requirements.

FIG. 2 shows a more robust design for addressing the leakage problem just described. Three stages are shown in circuit 200 of FIG. 2: a buffer stage 201a, a variable supply stage 202a, and a logical detect stage 204. As shown, the buffer stage supply node 210a is coupled to the variable supply stage output 211a at net 203; the buffer stage output 212a is coupled to the output node 104b and the logic detect stage input 213a at net 209; the logic detect stage output 214a is coupled to the variable supply stage input 215a at net 205 and the variable supply stage supply node 216a is coupled to supply node 105b. Input node 103b is coupled to buffer stage input 218a.

The buffer stage 201a is simply the inverter circuit 100 of FIG. 1. However, "buffer stages" may be almost any conceivable design having leakage. Variable supply stage 202a modulates the voltage or current applied to buffer stage supply node 210a in such a manner that voltage and/or current is limited when the logic detect stage 204 senses a logic low at output node 104b. A logic low at output node 104b means leakage is possible as input node 103b must be high. Thus the logic detect stage cuts off the power to buffer stage 201a if leakage is possible. Buffer stage supply node 210a reverts back to the supply voltage (i.e. voltage at supply node 105b) when the logic detect stage 204 senses a logic high. That is, the supply voltage returns when leakage is impossible (input node 103b is low).

Thus, the logical detect stage 204 merely detects the logic level at buffer stage output 212a.

In the example of circuit 200, variable supply stage 202a has a switch transistor 207 and a decoupling capacitor 208. Ideally, when there is no possibility of leakage (i.e., when input node 103b is low), switch transistor 207 is on and the full supply voltage appears at the buffer stage supply node 210a. When leakage is possible (i.e., when input node 103b is high), switch transistor 207 is off leaving the decoupling capacitor 208 as the sole voltage source at the source of PFET 101b. The decoupling capacitor 208 voltage is then a function of the amount of leakage through PFET 101b, if any exists.

Problems exist, however, if one employs a logic detect stage 204. One problem is that the voltage at buffer stage supply node 210a is cut off from supply node 105b even if no actual leakage exists. The voltage is cut off if leakage is merely possible. That is, if a CMOS level high signal (approx. 3.3) is placed at input node 103b the switch transistor 207 is cut off even though there is no risk of leakage through transistor 101b. Anytime the voltage at buffer stage supply node 210a is dropped, a corresponding reduction in circuit speed is realized. That is, at output node 104b there is typically some capacitive loading 217. Anytime the voltage at buffer stage 201a supply node 210a is reduced, the charge/discharge time at output node 104b lengthens. Thus use of a logic detect stage 204 results in slower circuit speed not only for TTL level but also CMOS level input signals at input node 103b.

A further problem involves decoupling capacitor 208 as shown and described with reference to FIG. 3. FIGS. 3a–3c show critical voltages for cases where the high to low transition of the input voltage at input node 103b is ideal. FIGS. 3d–3f show the same critical voltages if the input voltage transition is less than ideal. Use of circuit 200 of FIG. 2 results in improper circuit operation for the input voltage shown in FIG. 3d. Essentially circuit 200 only works for synchronous applications and not asynchronous applications.

"Synchronous" simply means some kind of clocking or other mechanism exists whereby critical voltages must make logic transitions (either high to low or low to high) within some limited time period. "Asynchronous" environments have no such limited time period. Therefore, it is possible for practically unlimited transition time periods (such as that shown in FIG. 3d) within asynchronous environments but not in synchronous environments (i.e., the transition shown in FIG. 3a is almost necessary in synchronous environments).

FIG. 3a is a schematic depiction of an ideal TTL input voltage signal. The fall time from the voltage high level ($V_{IH}$=2.4 volts) to the logic low level ($V_{IL}$=0.4 volts) is zero. Better put, the transition from logic high to logic low is instantaneous. For instantaneous transitions the source voltage of PFET transistor 101b and the output node 104b voltage are shown in FIGS. 3b and 3c respectively.

As shown in FIG. 3b, while the input node 103b voltage is at a TTL level logic high ($V_{IH}$=2.4 v), the source voltage of PFET 101b slightly less than $V_{IH}+V_T$ (=2.4+0.7=3.1). This voltage results from the fact that, as discussed, switch transistor 207 is cut off by logic detect stage 204 when logic level high signals are placed input node 103b. At the time switch transistor 207 is cut off, which is shortly after the input voltage transitions from low to high (not shown in FIG. 3a or 3d), the voltage at decoupling capacitor 208 (and the source of PFET 101b) is the full supply voltage at node 105b. This causes PFET 101b to leak. The source of leakage current is decoupling capacitor 208 since transistor 207 is cut off. As PFET 101b continues to leak, charge is continually drawn from decoupling capacitor 208 resulting in a continual voltage drop in decoupling capacitor 208 voltage and continued drop at the source of PFET 101b. This gradual decay in decoupling capacitor 208 voltage stops at the point where PFET 101b becomes cut off (i.e., when slightly less than the threshold voltage ($V_T$) appears across the gate-to-source region of PFET 101b.) The source of PFET 101b is then "stuck" at slightly less than $V_{IH}+V_T$ as no current path to ground exists from decoupling capacitor 208. This is the state shown in FIG. 3b prior to the high to low transition at $t_{oa}$.

Once there is a transition at input node 103b from logic high to logic low, as shown at $t_{oa}$ in FIGS. 3a–c, NFET 102b converts from on to off and PFET 101b turns from off to on as there is an instantaneous gate-to-source voltage of slightly less than 3.1 volts across transistor 101b at time $t_{oa}$. With transistor 101b "on" at time $t_{oa}$ the decoupling capacitor 208 voltage (3.1 volts) appears at output node 104b as shown in FIG. 3c. This enables inverter 206 of logic detect stage 204 to flip and place a logic level low signal at the variable supply stage input 215a at time $t_{oa}+\Delta t$ where $\Delta t$ is the propagation delay in logic detect stage 204. At time $t_{oa}+\Delta t$ switch transistor 207 is turned "on" which ultimately charges up decoupling capacitor 208 to the supply voltage of supply node 105b. Thus FIGS. 3a–3c show proper operation when the transition at input node 103b is ideal.

FIGS. 3d–3f show circuit operation when the input voltage ($V_{IN}$) transition is less than ideal. Specifically, when there is a long fall time from logic high to logic low ($t_{1a}-t_{oa}$). In this case the voltage at decoupling capacitor 208 is slightly less than 3.1 volts when the input voltage at input node 103b is high. In a somewhat iterative process, the decoupling capacitor 208 voltage (i.e., source voltage of PFET 101b) gradually decays along with the input voltage as shown in FIG. 3e.

The iterative process occurs as follows: first the decoupling capacitor decays to a voltage slightly less than $V_{IH}+V_T$ by time $t_{oa}$ as already discussed. Then, the input node 103b voltage ($V_{IN}$) drops slightly to $V_{IH}-\Delta V$ in accordance with the gradual decay shown in FIG. 3d. Once the input voltage drops to $V_{IH}-\Delta V$, the gate to source voltage of PFET 101b changes from slightly less than $V_T$ to slightly more than $V_T$. Thus transistor 101b changes from off to on and begins to leak charge out of decoupling capacitor 208. The leakage continues until the decoupling capacitor 208 voltage drops to slightly less than $V_{IH}+V_T-\Delta V$ which turns transistor 101b off. Thus by this process, the decoupling capacitor 208 voltage drops $\Delta V$ identically with the input voltage. As $V_{IN}$ continuously drops, so does the voltage at the source of transistor 101b.

Ultimately, the ramp down of the input voltage at input node 103b falls below $V_T$ (approximately equal to 0.7 v). At this point NFET 102b turns off and, ideally, PFET 101b turns on. However, because the source voltage of transistor 101b (i.e., the voltage across the decoupling capacitor 208) has been dragged down by the decaying input voltage there is simply no charge left in decoupling capacitor 208 to raise the output node 104b to a logic high level. Thus, inverter 206 never sees a high input and never switches transistor 207 on. Because input voltages such as those shown in FIG. 3d are conceivable within asynchronous environments solutions for the leakage problem such as those shown in FIG. 2 are simply unacceptable for asynchronous applications. Thus what is needed is an approach that operates within an asynchronous environment and/or does not limit circuit speed for CMOS level input signals.

SUMMARY OF THE INVENTION

A circuit for addressing leakage is described. The circuit may have a variable supply stage including an active load in parallel with a switch transistor where the active load and the switch transistor are coupled to a decoupling capacitor. The circuit may also have a leakage detect stage having a leak device coupled to a critical node.

An embodiment of the circuit may have a supply node; an input node; an output node; a buffer stage where the buffer stage supply node is coupled to a variable supply stage output, the buffer stage input is coupled to the input node and the buffer stage output is coupled to the output node; a leakage detect stage where the leakage detect stage supply node is coupled to the supply node and the leakage detect stage input is coupled to the input node; and a variable supply stage where the variable supply stage supply node is coupled to the supply node and the variable supply stage input is coupled to the leakage detect stage output.

Furthermore, the buffer stage may comprise an inverter circuit and the leakage detect stage may comprise a latch. The variable supply stage may comprise a switching circuit having an active load.

The leakage detect stage may have a leak device coupled to a critical node where the critical node is coupled to the leakage stage output. The leak device may be a leak transistor and the critical node may be coupled to a capacitive element where the capacitive element is the inherent capacitance associated with the metal interconnect lines of an integrated circuit. The critical node may also be coupled to a current shunt element for shunting leakage where the current shunt element is a reverse biased current balancing diode. Also, the critical node may be coupled to a discharge transistor for removing charge from the critical node.

Other features and advantages of the present invention will be apparent from the accompanying drawings and from the detailed description which follows below.

BRIEF DESCRIPTION OF THE DRAWINGS

FIG. 3b is the PFET 101b source voltage for the input transition of FIG. 3a.

FIG. 3c is the output node 104b voltage for the input transition of FIG. 3a.

FIG. 6b is a depiction of the PFET 101d source voltage for the embodiment of FIG. 5 resulting from the input transition of FIG. 6a.

FIG. 6c is a depiction of the output node 104d voltage for the embodiment of FIG. 5 resulting from the input transition of FIG. 6a.

DETAILED DESCRIPTION

A circuit for addressing leakage is described. The circuit may have a variable supply stage having an active load in parallel with a switch transistor where the active load and the switch transistor are coupled to a decoupling capacitor. The circuit may also have a leakage detect stage having a leak device coupled to a critical node.

One embodiment of the circuit may have a supply node; an input node; an output node; a buffer stage where the buffer stage supply node is coupled to a variable supply stage output, the buffer stage input is coupled to the input node and the buffer stage output is coupled to the output node; a leakage detect stage where the leakage detect stage supply node is coupled to the supply node and the leakage detect stage input is coupled to the input node; and a variable supply stage where the variable supply stage supply node is coupled to the supply node and the variable supply stage input is coupled to the leakage detect stage output.

Furthermore, the buffer stage may comprise an inverter circuit and the leakage detect stage may comprise a latch. The variable supply stage may comprise a switching circuit having an active load.

The leakage detect stage may have a leak device coupled to a critical node where the critical node is coupled to the leakage stage output. The leak device may be a leak transistor and the critical node may be coupled to a capacitive element where the capacitive element is the inherent capacitance associated with the metal interconnect lines of an integrated circuit. The critical node may also be coupled to a current shunt element for shunting leakage where the current shunt element is a reverse biased current balancing diode. Also, the critical node may be coupled to a discharge transistor for removing charge from the critical node.

These and other embodiments of the present invention may be realized in accordance with the following teachings and it should be evident that various modifications and changes may be made in the following teachings without departing from the broader spirit and scope of the invention. The specification and drawings are, accordingly, to be regarded in an illustrative rather than restrictive sense and the invention measured only in terms of the claims.

Figure 4:
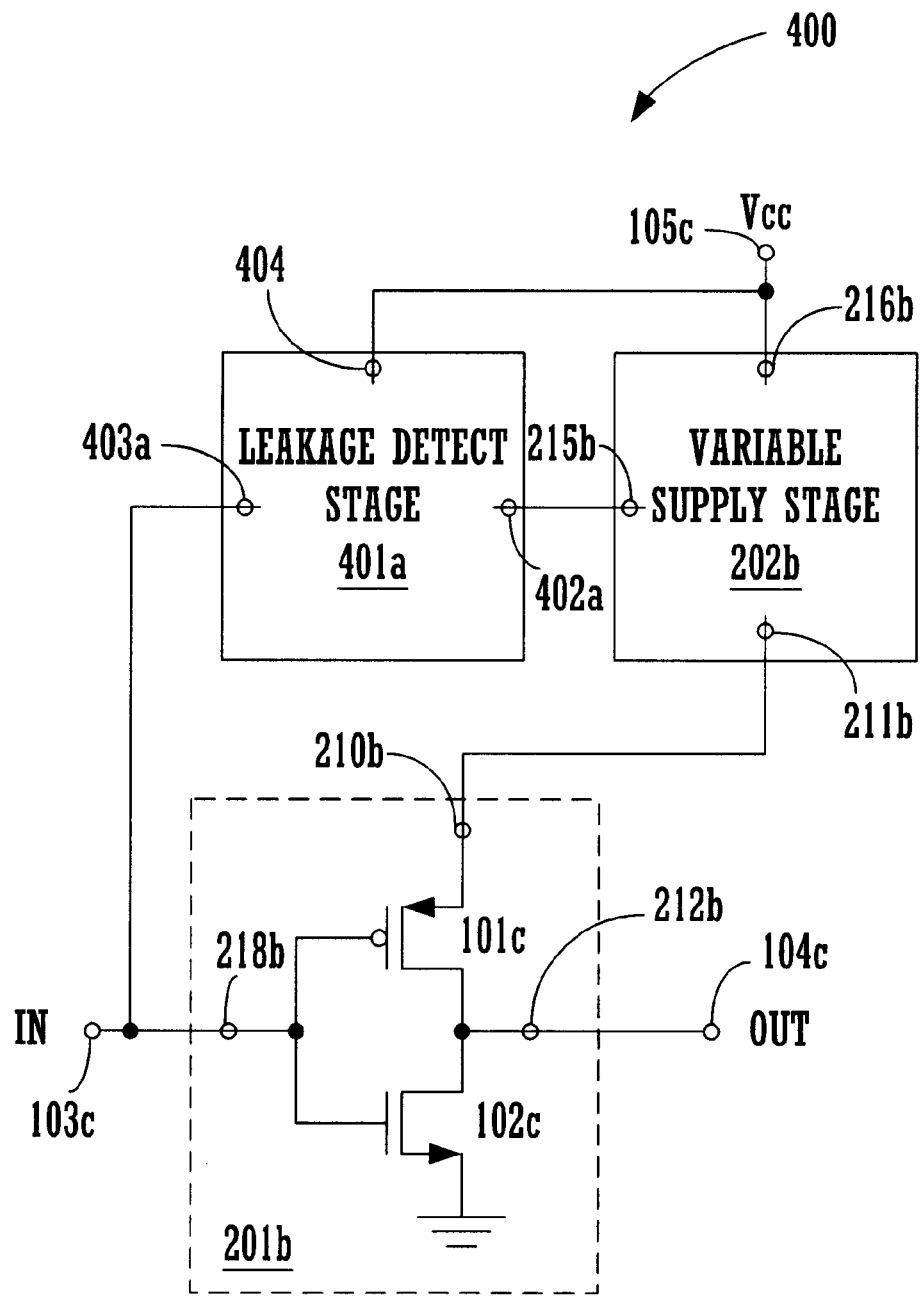
FIG. 4 is a depiction of a circuit for addressing leakage configured in accordance with the teachings presented below.

FIG. 4 shows a general depiction of one embodiment. Circuit 400 is suitable for asynchronous applications and does not reduce speed for CMOS level inputs. As shown in FIG. 4, Circuit 400, has a buffer stage 201b, a leakage detect stage 401a and a variable supply stage 202b. The buffer stage input 218b is coupled to the input node 103c and the leakage detect stage input 403a. The leakage detect stage output 402a is coupled to the variable supply stage input 215b. The variable supply stage output 211b is coupled to the buffer stage supply node 210b. The leakage detect stage and variable supply stage supply-nodes 404, 216b are coupled to the supply node 105c. Output node 104c is coupled to buffer stage 201b output node 212b.

In the embodiment shown in FIG. 4, buffer stage 201b is a CMOS inverter circuit. However, the inverter circuit shown in FIG. 4 is just one embodiment. The buffer stage according to this invention is any conceivable design having leakage. Leakage is simply any undesired current that can be reduced or eliminated by modulating the voltage current (or both) at the buffer stage supply node 210b.

Figure 1:
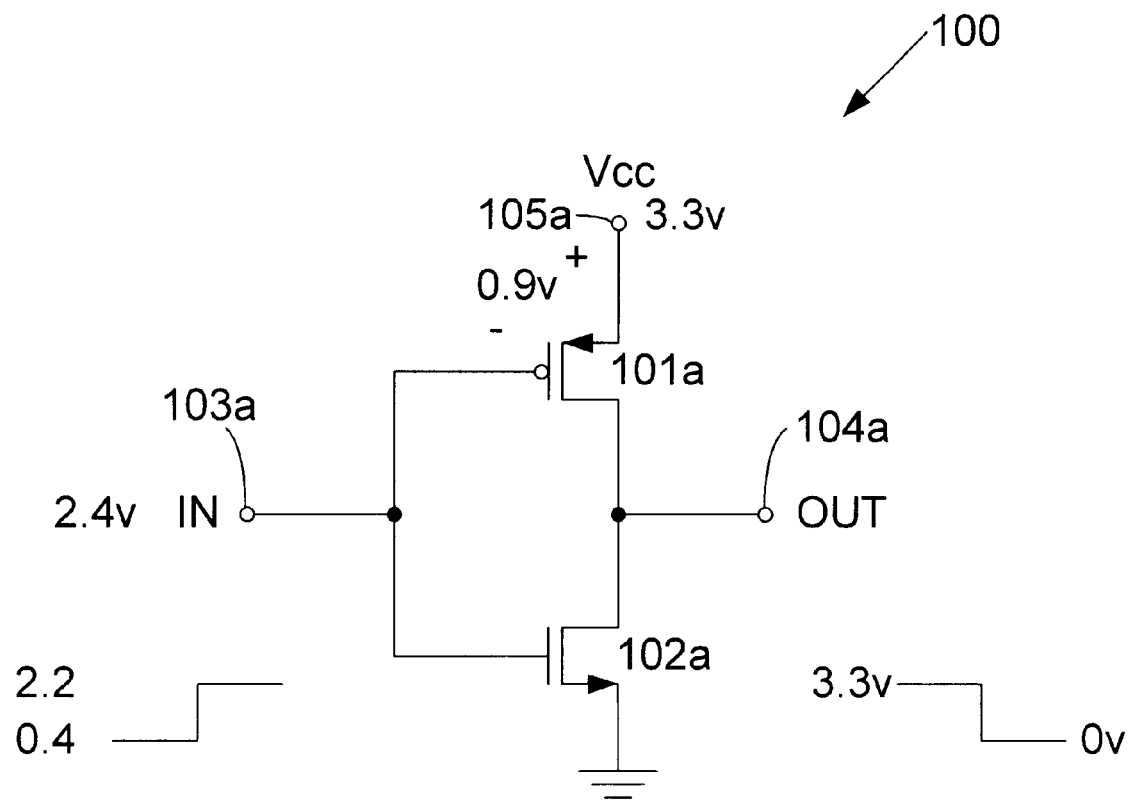
FIG. 1 is a depiction of a typical CMOS inverter.
Figure 2:
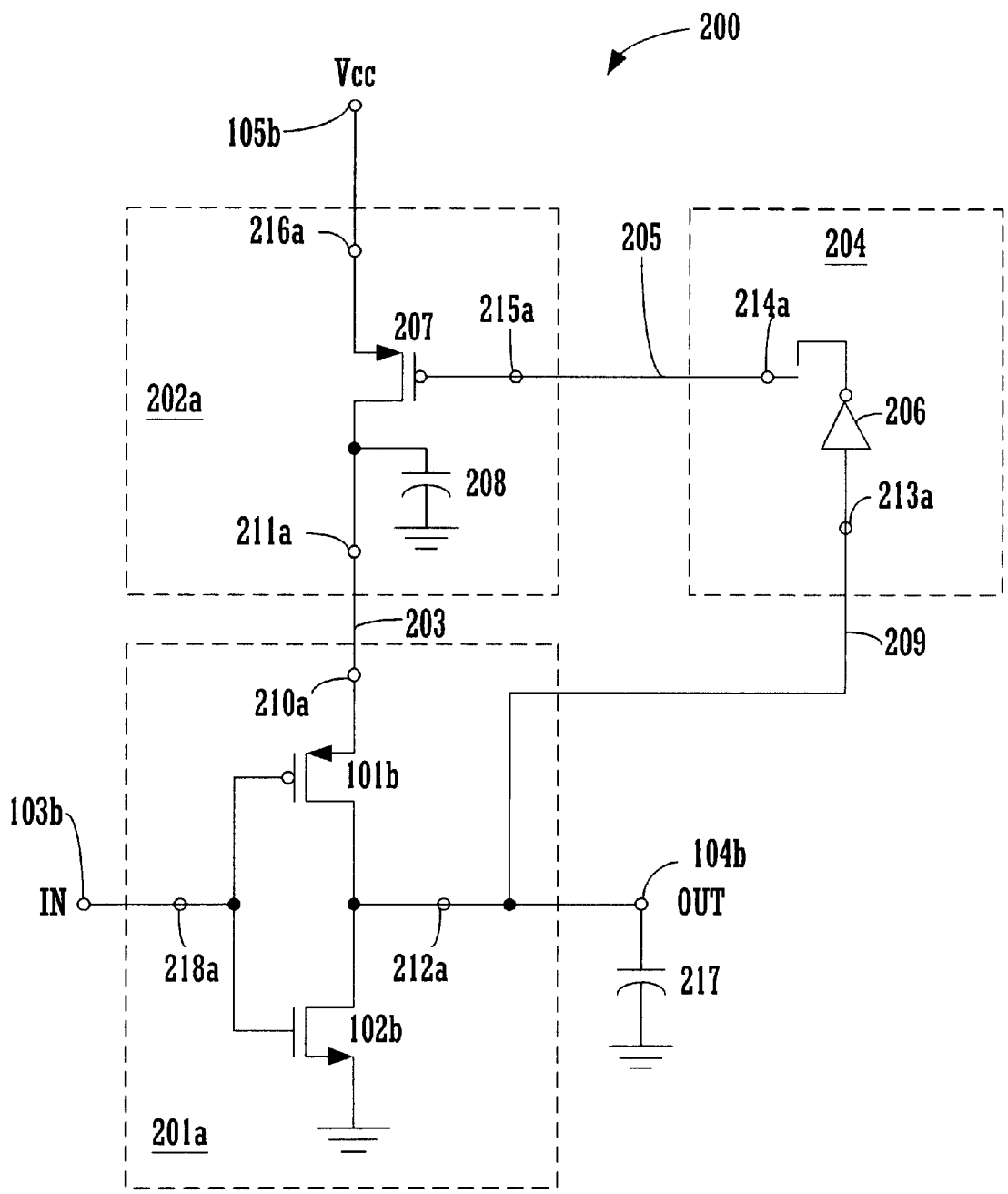
FIG. 2 is a depiction of a circuit for addressing a leakage problem.

The variable supply stage 202b is a type of switching circuit. Switching circuits modulate the voltage, current (or both) applied to the buffer stage supply node 210b. A supply node is any node used as a source for voltage and/or current. The variable supply stage 202b could be identical to the variable supply stage 202a of FIG. 2. However, as discussed, variable supply stage 202a of FIG. 2 only works acceptably within synchronous environments. Embodiments of the variable supply stage 202b other than the specific embodiment 202a of FIG. 2 are possible. One of these other embodiments, discussed ahead is capable of use within asynchronous environments. Thus variable supply stage 202b is intended to cover embodiments for synchronous as well as asynchronous applications.

Various embodiments may have a leakage detect stage 401a. Whereas the circuit 200 of FIG. 2 controlled the variable supply stage 202b with logic level detection, this invention may sense actual leakage within circuit 400. Thus a leakage detect stage 401a is a stage that detects actual leakage and directly or indirectly controls the variable supply stage 202b accordingly.

A leakage detect stage 401a has the advantage of reducing the supply voltage or current at buffer stage supply node 210b if and only if actual leakage is occurring. Thus, unlike the prior art which reduces the voltage at buffer stage supply node 210b for CMOS level inputs (which do not cause PFET 101c to leak) resulting in unnecessary degradation in speed, leakage detect stage 401a enables full speed operation for CMOS level inputs.

Of course, asynchronous applications that are insensitive to the degradation in speed for CMOS input signals may choose not to employ a leakage detect stage 401a. These applications may have an asynchronous embodiment of the variable supply stage 202b (such as the one discussed ahead) coupled to a logic detect stage 204 (referring back to FIG. 2). A logic detect stage directly or indirectly controls the variable supply stage 202b via detection of a logic signal as opposed to actual leakage. Thus various embodiments exist having an asynchronous variable supply stage 202a and a logic detect stage (such as logic detect stage 204 of FIG. 2).

Similarly, other embodiments exist within synchronous environments sensitive to the degradation in speed for CMOS signals. These embodiments may contain leakage detect stage 401a coupled to a synchronous variable stage 202a (such as the one shown in FIG. 2).

Figure 5:
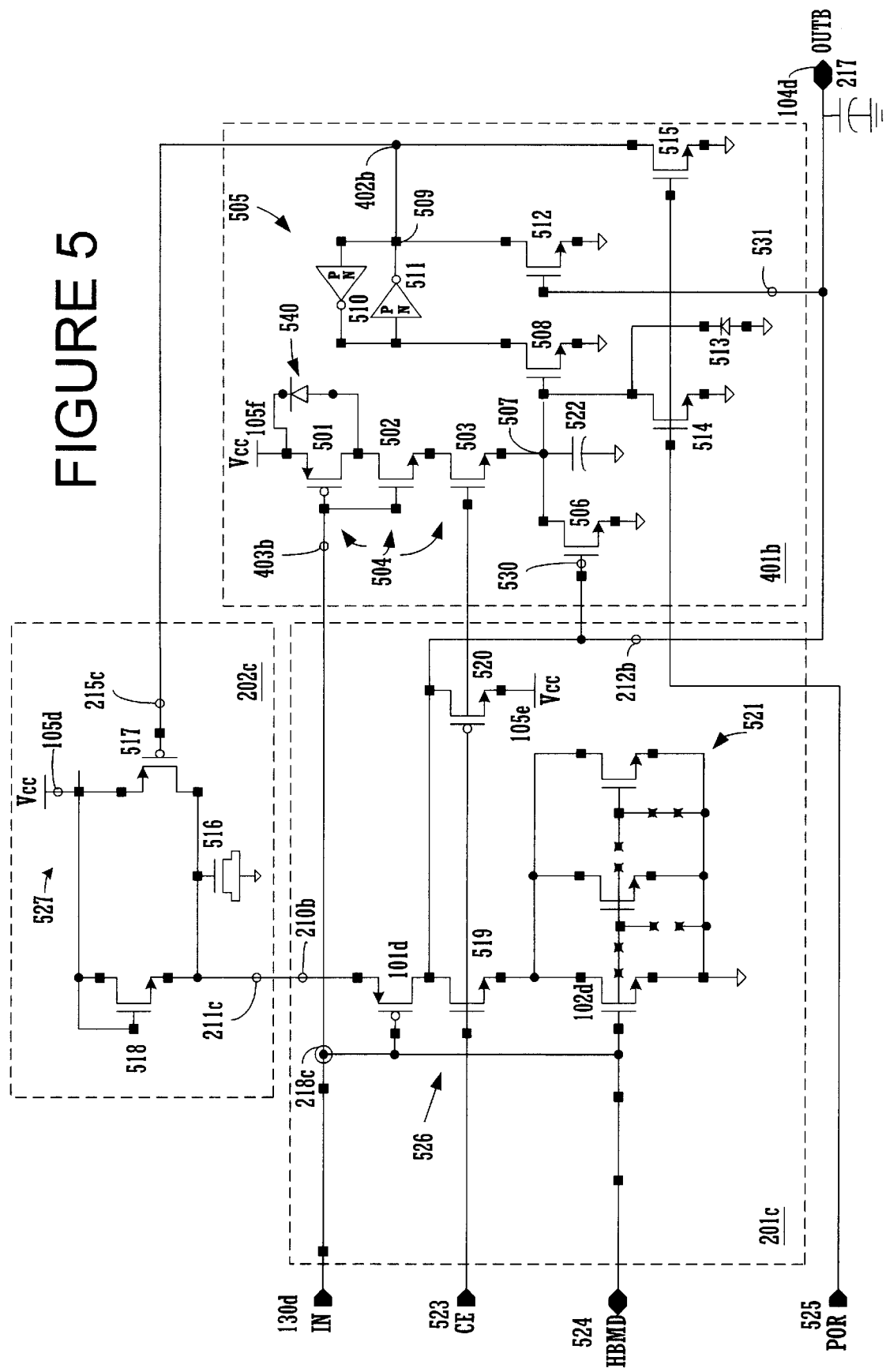
FIG. 5 is a more detailed depiction of one example of a circuit configured as shown in FIG. 4.

A specific embodiment of the circuit of FIG. 4 is shown in FIG. 5. This particular embodiment is for asynchronous applications that are sensitive to speed degradation for CMOS level input signals. Thus this specific embodiment shown in FIG. 5 employs: 1) a synchronous variable supply stage 202c that does not induce circuit performance degradation as shown back in FIGS. 3d–f and 2) a leakage detect stage 401b. As shown in FIG. 5, buffer stage input 218c is coupled to input node 103d and leakage detect stage input 403b. Leakage detect stage output 402b is coupled to variable supply stage input 215c. Variable supply stage output 211c is coupled to buffer stage supply node 210b.

Buffer stage 201c is comprised of many extraneous elements much of which is discussed later. For present purposes, buffer stage 201c is essentially an inverter circuit 526. This inverter circuit 526 includes an NFET 102d coupled to a PFET 101d. The gate node of both transistors 102d, 101d are coupled to the buffer stage input 218c. When input node 103d is a logic high, ideally NFET 102d is on and PFET 101d is off resulting in a logic low at buffer stage output 212b and output node 104d. It is this logic stage where leakage typically occurs. In this embodiment, input node 103d is also coupled to leakage detect stage input 403b.

The leakage detect stage input 403b is coupled to the totem pole arrangement 504. The totem pole arrangement 504 is a PFET transistor 501 atop NFET 502 atop "chip enable" NFET 503. Most critical to the arrangement 504 is the "leak transistor", PFET 501. Essentially, actual leakage through leak transistor 501 is sensed by leakage detect stage 401b and such detection is used to control variable control stage 202c.

Although this embodiment shows a leak transistor 501, in a more broad sense, other structures could be used. For example, a standard test cite structure or diode could be used. Thus the invention extends to "leak devices", generally not just a leak transistor 501. A leak device is any structure intentionally formed to produce leakage or produce an "on" channel at a critical circuit state or transition during which leakage may occur. In the embodiment of FIG. 5, a leak transistor is employed because it is desirable to have leakage through the leak device if and only if PFET 101d is leaking. Thus it is desirable not only to use a leak transistor but also use a leak transistor having identical dimensions, doping profiles, etc. as PFET 101d. Thus it is preferable to use leak devices that replicate the structure or leakage that occurs within the buffer stage 201.

The leakage current through leak transistor 501, if any exists, flows through NFET 502 and chip enable transistor 503. When the logic level at input node 103d is high (for either TTL or CMOS level inputs), NFET 502 is on. Obviously, chip enable transistor 503 is also on and Power On Reset transistor 514 is off. Transistor 506 is off as discussed later. Thus all leakage current must charge the capacitive element 522 at critical node 507. As the leakage current charge the capacitive element 522, critical node 507 is responsive to the leakage according to:

$$V_{critical\,node} = \frac{1}{C} \int I_{leakage}\, dt \qquad \text{<equation 1>}$$

where C is the capacitance of the capacitive element 522, $I_{leakage}$ is the leakage current and $V_{critical\,node}$ is the voltage of the critical node 507.

Thus in this embodiment, the voltage at the critical node 507 rises over time as leakage current continues to flow. Referring to FIG. 5, once the critical node voltage is sufficient to turn on latch input transistor 508 the latch output node 509 is converted to a logic high. As the latch output node 509 is coupled to the leakage detect stage output node 402b, the logic high is delivered to the variable supply stage input 215c.

The critical node 507 is any node that is responsive to the leakage current and, as such, many possible critical node embodiments exist. For example, instead of employing a capacitive element, a resistive element can be used. Further still, an ammeter circuit could be employed to sense the leakage current. In such an embodiment, by definition the ammeter output is the critical node. Thus the critical node is any node that is responsive to the leakage current and is not necessarily a node through which leakage current flows.

Furthermore, the capacitive element 522 of the embodiment shown in FIG. 5 is the inherent capacitance associated with the metal interconnect lines of an integrated circuit. Furthermore, in embodiments (such as the embodiment shown in FIG. 5) having a transistor or device coupled to the critical node 507 (such as transistors 506, 508) the capacitive element 522 includes the inherent capacitance (e.g., gate, source, drain) associated with the transistor or device. Also, other embodiments such as deliberate capacitive structures may be employed as well. However, deliberate capacitive elements may slow the response time as they are relatively large structures. For typical device geometries the leakage current is only about 1–100 $\mu$A.

Continuing with an operational description of FIG. 5, the logic high at variable supply stage input node 215c turns off switch transistor 517. This ends the previously uninterrupted coupling between supply node 105d and buffer stage supply node 210b. Thus the desired action of cutting the supply voltage at the source node of PFET 101d when actual leakage occurs is accomplished.

At this point PFET 101d continues to leak while decoupling capacitor 516 sources the leakage current thereby reducing its voltage accordingly. Thus the decoupling capacitor 516 voltage drops gradually as PFET 101d continues to leak. Ultimately a steady state condition is reached, as shown in the first portion of time (up to $t_{oa}$) in FIG. 6b, where the decoupling capacitor 516 voltage (and PFET 101d source node) is slightly less than the TTL level high input (at input node 103d) plus the threshold voltage (=2.4+0.7=3.1 volts). Thus, in this steady state, the source voltage of PFET 101d is slightly less than 3.1 volts and PFET 101d is cut off.

Figure 3A:
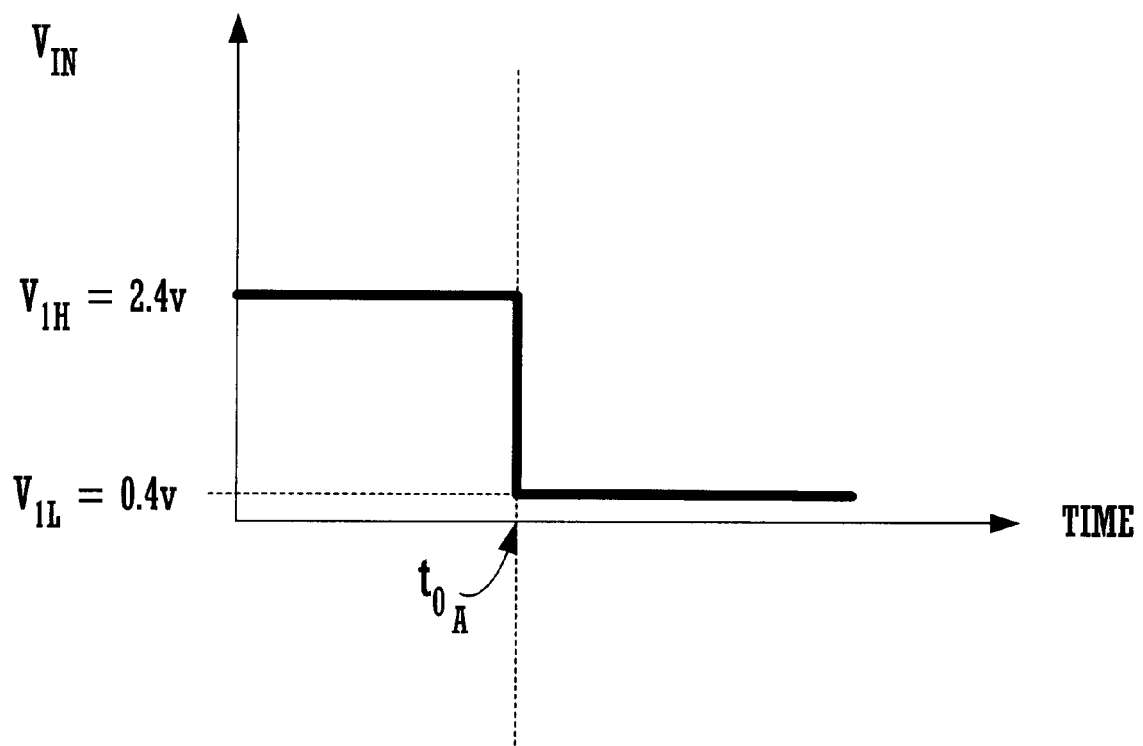
FIG. 3a is a depiction of an ideal high to low $V_{IN}$ transition at input node 103b of FIG. 2.
Figure 3B:
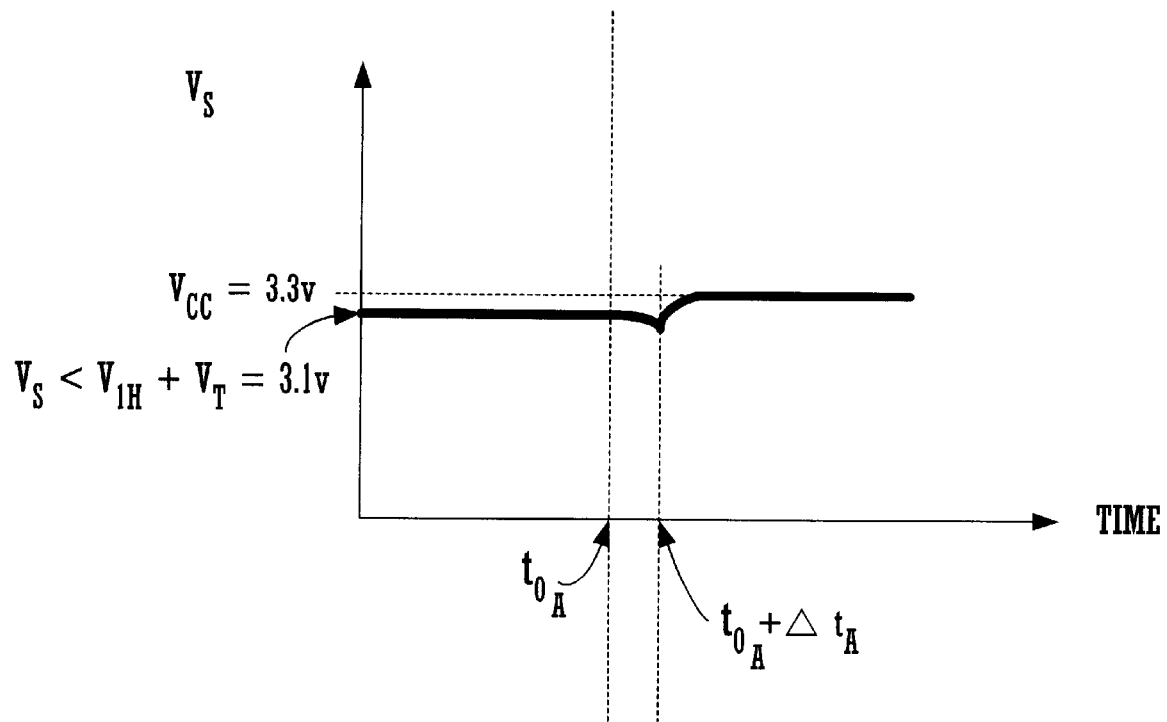
Figure 3C:
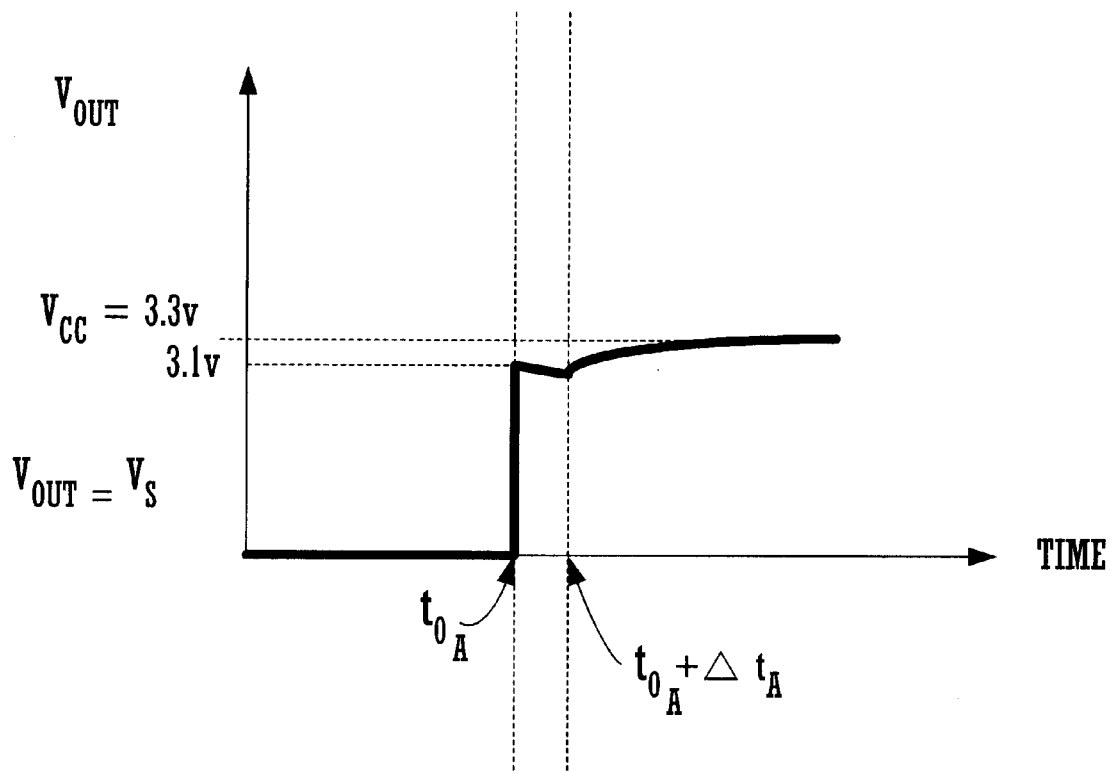
Figure 3D:
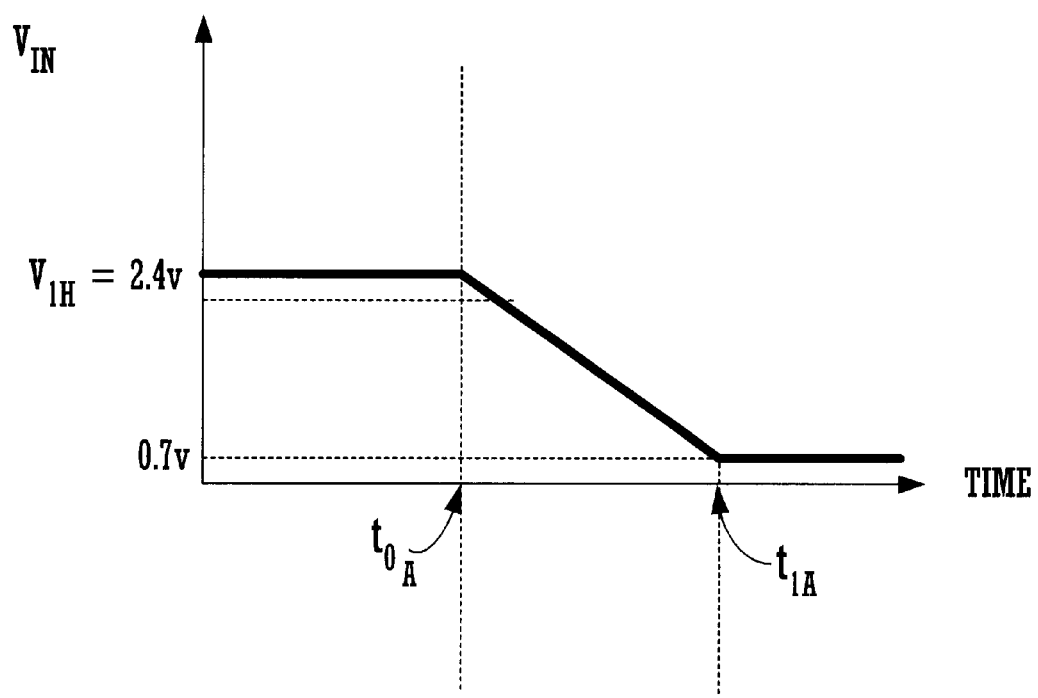
FIG. 3d is a depiction of a non-ideal high to low input transition.
Figure 3E:
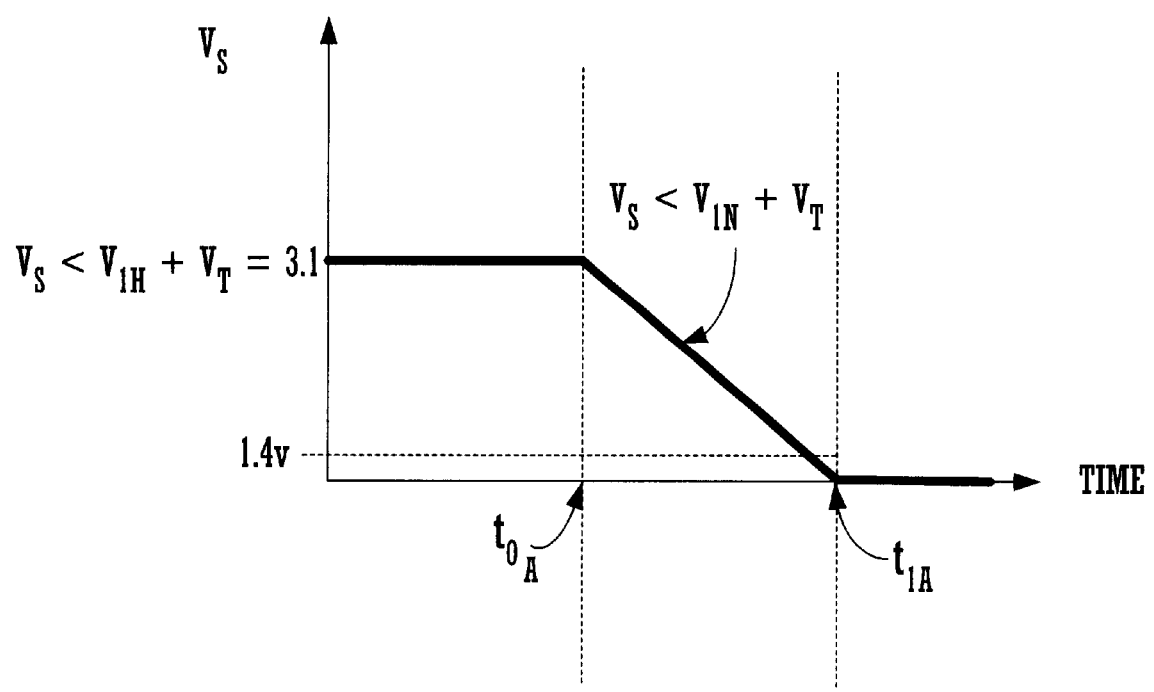
FIG. 3e is the PFET 101b source voltage for the input transition of FIG. 3d.
Figure 3F:
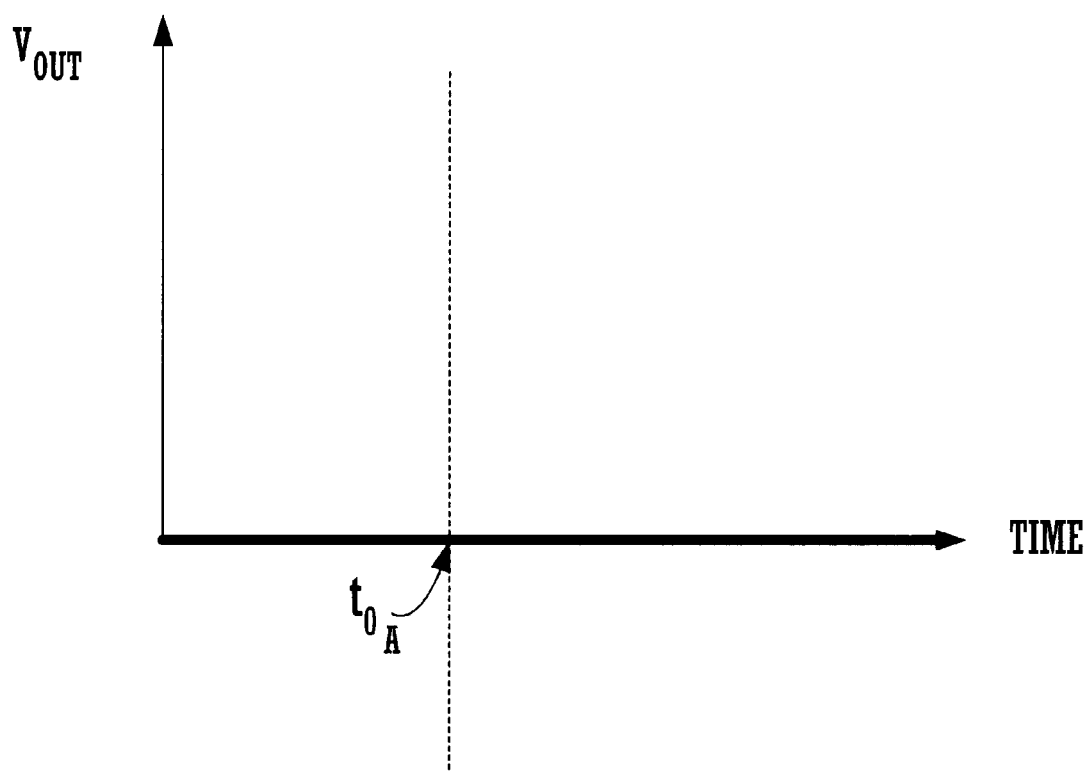
FIG. 3f is the output node 104b voltage for the input transition of FIG. 3d.
Figure 6A:
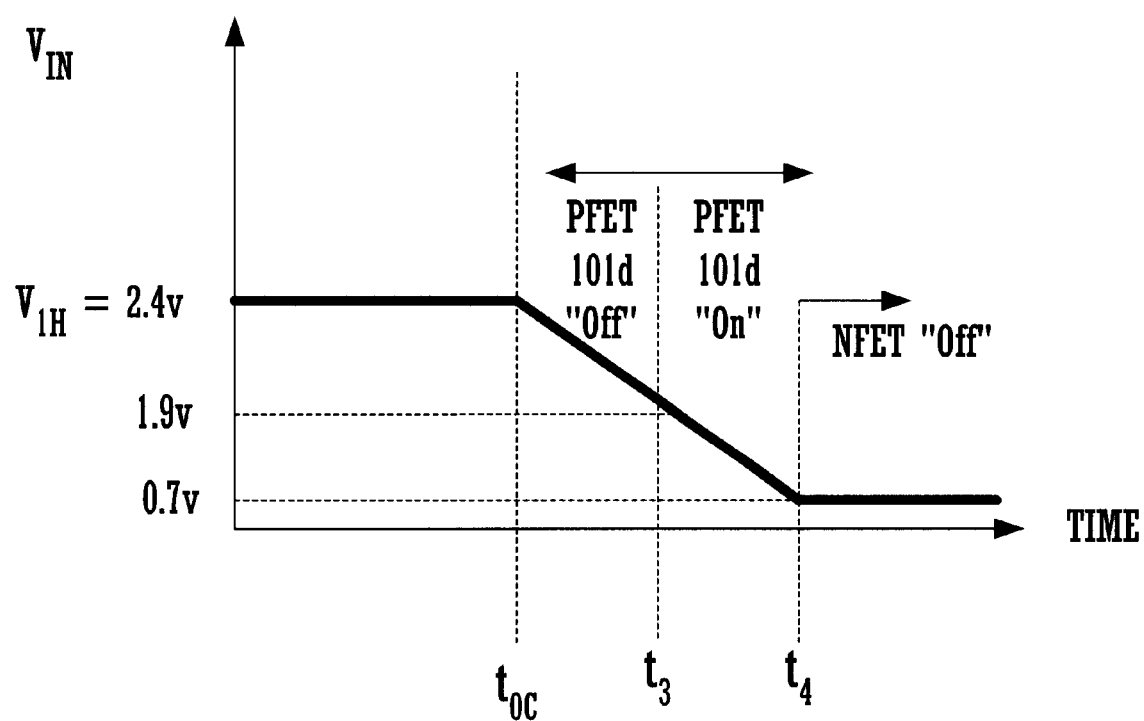
FIG. 6a is a depiction of a non-deal high to low input transition at input node 103d of FIG. 5.

At this point, if the input voltage at input node 103d transitions slowly from the logic high state to a logic low level (as shown in FIG. 6a and FIG. 3d) the circuit of FIG. 5 behaves differently than that shown in FIGS. 3e and 3f which are associated with the circuit of FIG. 2. That is, the asynchronous embodiment of the variable supply stage 202b of FIG. 4 is now described.

After time $t_{OC}$, when the input voltage begins to gradually decline, the source voltage of PFET 101d begins to gradually decline identically to the iterative process described previously. That is, the source voltage simply follows a voltage path slightly less than $V_{IN}+V_T$. However, once the voltage of the decoupling capacitor 516 drops to a value Vcc–$V_T$ (equal to 3.3–0.7=2.6 volts) active load transistor 518 turns on and clamps decoupling capacitor 516 and PFET 101d source node to approximately Vcc–$V_T$ volts. Thus a key difference between the synchronous variable supply stage 202a of FIG. 2 is use of an active load in parallel with the switch transistor 517. As the gate and drain of active load 518 are tied together, active load 518 has a voltage current relationship according to:

$$V_{DS} = V_T + \sqrt{\frac{I_{DS}}{\beta}} \qquad \text{<equation 2>}$$

where $V_{DS}$ is the drain/source voltage, $V_T$ is the threshold voltage, $I_{DS}$ is the drain/source current and $\beta$ is the transistor gain.

As the leakage current that continues to flow through PFET 101d (equal to $I_{DS}$ of active load 518) is small, the voltage drop across active load 518 is approximately $V_T$.

Different embodiments exists for the asynchronous variable supply stage. That is, an asynchronous supply stage is not limited to designs having only active loads but extends instead to any device that holds the decoupling capacitor 516 voltage such that the capacitor does not track a slowly decaying input voltage as shown in FIG. 3E. Thus, clamping devices include active loads, diodes, totem pole structures or other similar limiting devices.

Figure 6B:
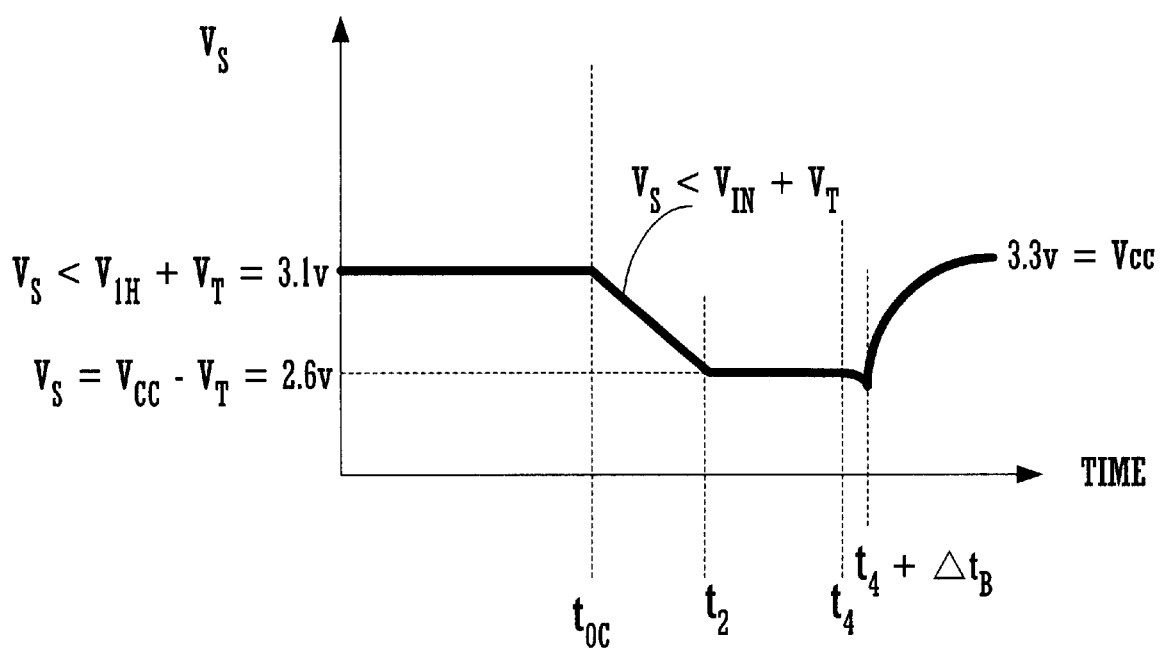
Figure 6C:
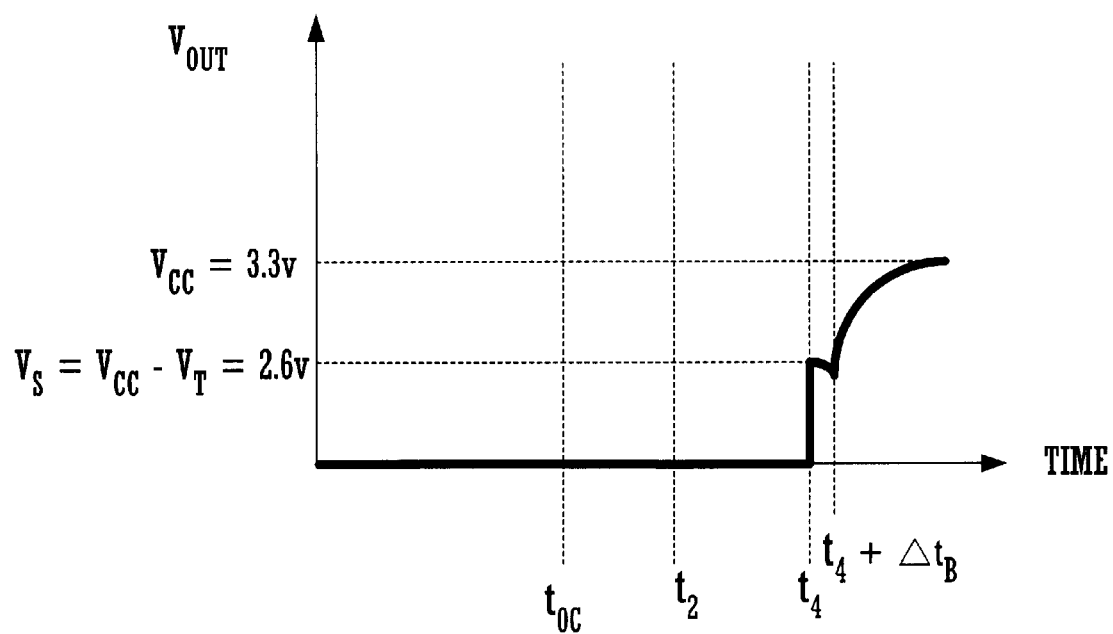

After decoupling capacitor 516 voltage is clamped the input voltage continues to decay (comparing FIGS. 6a and 6b). Once the input voltage drops to a value one threshold below the clamped voltage of active load 518 the PFET 101d turns permanently on (time $t_3$ of FIG. 6a). However, even though PFET 101d is on, the input voltage is still above the threshold voltage NFET 102d. Therefore NFET 102d is still on, resulting in buffer stage output 212b continuing to be grounded as shown in FIG. 6c. In order to help ensure that $V_s$ does not drop after $t_3$ because 101d is on (which would pull substantial current through active load 518) it is recommended that $\beta_{518}$ be sufficiently larger than $\beta_{102d}$. Once, however, the input voltage drops to a level just below the threshold voltage of NFET 102d (0.7 volts), the NFET transistor 102d turns off. This is time $t_4$ in FIGS. 6a–6c.

Thus at time $t_4$ NFET transistor 102d is off and PFET 101d is on. The result is the full source voltage of PFET 101d at the buffer stage output 104e as shown in FIG. 6c. At this point the problem described in relation to FIGS. 3d–3f is avoided. That is, voltage exists at the source of PFET 101d sufficient to switch any downstream logic even though the input voltage has gradually decayed.

Once the logic level of buffer stage output 212b shifts from logic low to logic high at time $t_4$ of FIG. 6 a series of events occur. First, discharge transistor 506 turns on which removes the charge from capacitive element 522 thereby dropping the critical node 507 voltage to 0. This turns off latch input transistor 508. Also, as the buffer stage output 212b voltage is high, latch input transistor 512 is turned on. This sets the latch output 509 to a low logic level which subsequently turns on switch transistor 517 in the variable supply stage 202c. In the transient time $\Delta t_B$, (from $t_4$ to $t_4+\Delta t_B$, referring to FIG. 6) that it takes to flip latch 505, the voltage on the decoupling capacitor 518 may decay slightly as the current through p-channel FET 101d increases in order to drive any capacitive load 217 that may exist at output node 104d. However, this decay may be minimized as the capacitance of capacitor 518 is increased well beyond the capacitance of capacitive load 217. Once the transient time to flip the latch has passed ($\Delta t_B$) and switch transistor 517 is turned on, decoupling capacitor 516 voltage ramps up to the full supply node 105d voltage (3.3 volts).

A few details of the leakage detect stage 401b are discussed next. Specifically, transistors have a parasitic diode (e.g., parasitic diode 540) associated with the drain/substrate and source/substrate junctions. The effects of parasitic diode 540 are typically noticeable only when the transistor is off because the parasitic diode leakage is small (typically, 10 pA to 10 nA) compared to "on" transistor currents. When leak transistor 501 is off due to a CMOS level input at input node 103d, the parasitic diode 540 produces such a small leakage current from the supply node 105f which ultimately charges capacitive element 522.

Thus even for CMOS level inputs, the critical node 507 voltage increases according to equation 1. As the leakage current when leak transistor 501 is off (CMOS level high input) is much smaller than the leakage current when leak transistor 501 is on (TTL level high input), the charging rate of capacitive element 522 is much slower for parasitic diode 540 induced leakage currents. Thus in most cases the leakage current associated with parasitic diode 540 is not a problem as a logic low input appears before the critical node voltage rises substantially.

Nevertheless, it is possible (especially within asynchronous applications) a CMOS level high input signal may appear at the gate of leak transistor 501 indefinitely such that the critical node voltage rises to a level that causes latch 505 to flip incorrectly. In the embodiment of FIG. 5, reversed biased current balancing diode 513 is coupled to critical node 507 in order to shunt the parasitic diode 540 leakage current away from capacitive element 522 thereby stabilizing the critical node 507 voltage. As long as the leakage current of reversed biased current balancing diode 513 is greater than the leakage current of parasitic diode 540, capacitive element 522 cannot accumulate enough charge to flip latch 505. This is usually accomplished by simply making the surface area of reverse biased current balancing diode 513 greater than the area of parasitic diode 540.

Reversed biased current balancing diode 513 is essentially a current shunt element. Thus any device capable of shunting charge away from capacitive element 522 may be used in place of reverse biased current balancing diode 513.

As discussed, discharge transistor 506 resets critical node 507 to ground level while the input voltage is low, thus preventing voltage build up on node 507 during subsequent high level inputs. The Power on Reset (POR) node 525 is used to ground the critical node 507 (via transistor 514) and the leakage detect stage 401b output 402b (via transistor 515) during a reset. The Chip Enable node 523 is used to ground the output node 104d (via transistor 520) and isolates the leak transistor 501 from the critical node 507 (via transistor 503) when the Chip Enable node 523 is at a logic low. Transistor network 521 is used to adjust the trip point of inverter 526.

Although only a 3.3 v supply node 105d voltage has been discussed in the specific embodiment of FIG. 5, it is readily apparent the concepts discussed herein are not solely limited to 3.3 v supply applications. For example, the invention is easily employed within 5 v supply applications provided the device that clamps the decoupling capacitor 516 voltage sustains a larger voltage drop. That is, as shown in FIG. 6B, the clamping voltage occurs at $V_s=V_{cc}-V_T=2.6$ v which is less than 3.1 v. $V_s$ will stabilize at approximately 3.1 $v=V_{IH}+V_T$ for most all applications (since typically $V_{IH}=2.4$ v and $V_{TH}=0.7$ regardless of the supply voltage employed.) Thus the clamping voltage must be at 3.1 v or less. Thus for 5 v applications there must be at least a 1.9 v voltage drop. One embodiment for 5 v supply applications is a triple totem pole structure of active load devices having a voltage drop of 2.1 v (equal 3×0.7) which therefore clamps the PFET 101d at 2.9 v (which is less than or equal to 3.1 v as required).

Thus, a novel scheme for reducing current on an input buffer has been described.

What is claimed is:

1. A circuit, comprising:
 a supply node, an input node and an output node;
 a buffer stage, a buffer stage supply node coupled to a variable supply stage output, a buffer stage input coupled to said input node, a buffer stage output coupled to said output node;
 a leakage detect stage, a leakage detect stage supply node coupled to said supply node, a leakage detect stage input coupled to said input node;
 a variable supply stage, a variable supply stage supply node coupled to said supply node, a variable supply stage input coupled to a leakage detect stage output; and
 said leakage detect stage further comprises a latch having a latch output, said latch output coupled to said leakage detect stage output.

2. The circuit of claim 1 wherein said buffer stage comprises an inverter circuit having and input and an output, said inverter circuit input coupled to said buffer stage input, said inverter circuit output coupled to said buffer stage output.

3. The circuit of claim 2 wherein said inverter further comprises a CMOS inverter circuit.

4. The circuit of claim 1 wherein said variable supply stage further comprises a switching circuit, said switching circuit having an active load.

5. The circuit of claim 4, wherein said switching circuit further comprises a switching transistor in parallel with said active load.

6. A circuit, comprising:

a supply node, an input node and an output node;

a buffer stage, a buffer stage supply node coupled to a variable supply stage output, a buffer stage input coupled to said input node, a buffer stage output coupled to said output node;

a leakage detect stage, a leakage detect stage supply node coupled to said supply node, a leakage detect stage input coupled to said input node; and a variable supply stage, a variable supply stage supply node coupled to said supply node, a variable supply stage input coupled to a leakage detect stage output, said variable supply stage comprising a switching circuit comprising a switching transistor in parallel with an active load.

7. The circuit of claim 6 wherein said buffer stage comprises an inverter circuit having and input and an output, said inverter circuit input coupled to said buffer stage input, said inverter circuit output coupled to said buffer stage output.

8. The circuit of claim 7 wherein said inverter further comprises a CMOS inverter circuit.

9. A circuit, comprising:

a supply node, an input node and an output node;

a buffer stage, a buffer stage supply node coupled to a variable supply stage output, a buffer stage input coupled to said input node, a buffer stage output coupled to said output node;

a leakage detect stage, a leakage detect stage supply node coupled to said supply node, a leakage detect stage input coupled to said input node, said leakage detect stage having a leak device coupled to a critical node, said critical node coupled to a leakage detect stage output and coupled to a current shunt element for shunting parasitic diode leakage, wherein said current shunt element comprises a reverse biased current balancing diode; and a variable supply stage, a variable supply stage supply node coupled to said supply node, a variable supply stage input coupled to said leakage detect stage output.

10. The circuit of claim 9 wherein said leak device is a leak transistor.

11. The circuit of claim 10 wherein said leak transistor is a PFET.

12. The circuit of claim 9 further comprising said critical node coupled to a capacitive element.

13. The circuit of claim 12 wherein said capacitive element is the inherent capacitance associated with at least one of a plurality of metal interconnect lines of an integrated circuit, such that said at least one of said plurality of metal interconnect lines produces a capacitance at said critical node.

14. The circuit of claim 9 wherein said leakage detect stage further comprises said critical node coupled to a discharge transistor for removing charge from said critical node.

15. The circuit of claim 14 wherein said discharge transistor removes charge only when said leakage is no longer occurring.

16. The circuit of claim 9 further comprising a latch having a latch input and a latch output, said latch output coupled to said leakage detect stage output, said latch input coupled and responsive to said critical node.

17. The circuit of claim 9 wherein said variable supply stage further comprises a switching circuit, said switching circuit having a clamping device.

18. The circuit of claim 17 wherein said switching circuit further comprises a switching transistor in parallel with said clamping device.

19. A circuit, comprising:

a supply node, an input node and an output node;

a buffer stage, a buffer stage supply node coupled to a variable supply stage output, a buffer stage input coupled to said input node, a buffer stage output coupled to said output node;

a leakage detect stage, a leakage detect stage supply node coupled to said supply node, a leakage detect stage input coupled to said input node, said leakage detect stage comprising a leak device coupled to a critical node, said leakage detect stage further comprising a latch having a latch input and a latch output, said latch output coupled to said leakage detect stage output, said latch input coupled and responsive to said critical node; and a variable supply stage, a variable supply stage supply node coupled to said supply node, a variable supply stage input coupled to said leakage detect stage output.

20. The circuit of claim 19 wherein said leak device is a leak transistor.

21. The circuit of claim 20 wherein said leak transistor is a PFET.

22. The circuit of claim 19 further comprising said critical node coupled to a capacitive element.

23. The circuit of claim 22 wherein said capacitive element is the inherent capacitance associated with at least one of a plurality of metal interconnect lines of an integrated circuit, such that said at least one of said plurality of metal interconnect lines produces a capacitance at said critical node.

24. The circuit of claim 19 wherein said leakage detect stage further comprises said critical node coupled to a current shunt element for shunting parasitic diode leakage.

25. The circuit of claim 19 wherein said leakage detect stage further comprises said critical node coupled to a discharge transistor for removing charge from said critical node.

26. The circuit of claim 25 wherein said discharge transistor removes charge only when said leakage is no longer occurring.

27. The circuit of claim 19 wherein said variable supply stage further comprises a switching circuit, said switching circuit having a clamping device.

28. The circuit of claim 27 wherein said switching circuit further comprises a switching transistor in parallel with said clamping device.

29. A circuit, comprising:

a supply node, an input node and an output node;

a buffer stage, a buffer stage supply node coupled to a variable supply stage output, a buffer stage input coupled to said input node, a buffer stage output coupled to said output node;

a leakage detect stage, a leakage detect stage supply node coupled to said supply node, a leakage detect stage input coupled to said input node, said leakage detect stage having a leak device coupled to a critical node, said critical node coupled to a leakage detect stage output; and a variable supply stage, a variable supply stage supply node coupled to said supply node, a variable supply stage input coupled to said leakage detect stage output, said variable supply stage further comprising a switching circuit, said switching circuit comprising a clamping device and wherein said switching circuit further comprises a switching transistor in parallel with said clamping device, wherein said clamping device is an active load.

30. The circuit of claim 19 wherein said leak device is a leak transistor.

31. The circuit of claim 30 wherein said leak transistor is a PFET.

32. The circuit of claim 29 further comprising said critical node coupled to a capacitive element.

33. The circuit of claim 32 wherein said capacitive element is the inherent capacitance associated with at least one of a plurality of metal interconnect lines of an integrated circuit, such that said at least one of said plurality of metal interconnect lines produces a capacitance at said critical node.

34. The circuit of claim 29 wherein said leakage detect stage further comprises said critical node coupled to a current shunt element for shunting parasitic diode leakage.

35. The circuit of claim 29 wherein said leakage detect stage further comprises said critical node coupled to a discharge transistor for removing charge from said critical node.

36. The circuit of claim 35 wherein said discharge transistor removes charge only when said leakage is no longer occurring.

* * * * *